(12) United States Patent
Radford et al.

(10) Patent No.: US 6,261,869 B1
(45) Date of Patent: Jul. 17, 2001

(54) HYBRID BGA AND QFP CHIP PACKAGE ASSEMBLY AND PROCESS FOR SAME

(75) Inventors: Susan K. Radford, Fort Collins; Gerald J. D'Amato, Loveland, both of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/365,037

(22) Filed: Jul. 30, 1999

(51) Int. Cl.[7] ...................................... H01L 21/24
(52) U.S. Cl. ........................ 438/123; 438/127; 438/106
(58) Field of Search ........................ 257/690, 693, 257/735, 738, 747, 780, 781, 787; 438/112, 117, 118, 123, 124, 127

(56) References Cited

U.S. PATENT DOCUMENTS

| | | | | |
|---|---|---|---|---|
| 5,563,446 | * | 10/1996 | Chia | 257/704 |
| 5,569,955 | * | 10/1996 | Chillara | 257/666 |
| 5,693,980 | * | 12/1997 | Sugahara | 257/206 |
| 5,705,851 | * | 1/1998 | Mostafazadeh | 257/675 |
| 5,777,387 | * | 7/1998 | Yamashita | 257/737 |
| 5,789,811 | * | 8/1998 | Chia | 257/704 |
| 5,969,426 | * | 10/1999 | Baba | 257/778 |
| 6,022,759 | * | 2/2000 | Seki | 438/123 |
| 6,031,281 | * | 2/2000 | Kang | 257/692 |
| 6,071,755 | * | 6/2000 | Baba | 438/106 |

* cited by examiner

*Primary Examiner*—Mary Wilczewski
*Assistant Examiner*—David Goodwin

(57) ABSTRACT

The present invention provides a hybrid chip package that utilizes a high-speed BGA structure and a plurality of flexible and reliable QFP leads. More specifically, the QFP leads are attached to a peripheral region of a substrate to surround the attached BGA structure and replace solder bumps of a conventional BGA structure that would typically flack or crack during operational cycles to create an electrical open between the conventional BGA package and the attached printed circuit board.

9 Claims, 5 Drawing Sheets

HYBRID BGA AND QFP CHIP PACKAGE ASSEMBLY AND PROCESS FOR SAME

BACKGROUND OF THE INVENTION

1. Field of the Invention

This invention relates in general to a chip package that utilizes both BGA and QFP lead types, and more particularly to a process and assembly for a hybrid chip package that can accommodate the temperature changes of a high-speed device and how they translate to the package materials and associated printed circuit board.

2. Description of the Related Art

In response to current demands from the electronics industry to produce smaller, faster, and more reliable devices, many semiconductor manufacturers have looked at exploiting the advantages of ball grid array ("BGA") technology. There are three major types of BGA assemblies in use today primarily differentiated by the substrate type: tape ball grid array ("TBGA"), plastic or laminate ball grid array ("PBGA") and ceramic ball grid array ("CBGA").

FIGS. 1A and 1B show a cross-sectional and a top plan view of a conventional high-speed BGA package 9A before being attached to a printed circuit board ("PCB"). More specifically, these figures show a BGA substrate 15 having contact wires 17 and a solder bump structure 19. Contact wires 17 mount between the chip contact terminals 11A and the substrate contact terminals 15A. The solder bump structure 19 includes an array of solder bumps 19A and pads 19B attached to the bottom surface of the substrate 15 to establish a connection with the contact wires 17 and chip 11 through the substrate 15. A protective layer 13, of a material such as an epoxy resin, is deposited to encapsulate the chip 11, the contact wires 17, and a portion of the substrate 15.

Once the above package is attached to a PCB 20 by a known method (see FIG. 2), the chip can be activated. During operation, the chip 11 will cycle through high and low temperatures which will in turn strain the resultant structure near a peripheral region 21 where the solder balls 19A contact the PCB contacts. This strain is due to different coefficient of thermal expansion ("CTE") properties of the assembly. More specifically, the PCB 20 provides a greater CTE change S1 during operation than the CTE change S2 provided by the package. These strains induce the BGA joints to flake 19C and crack 19D as illustrated in FIG. 2.

Currently, the chip package of choice for high-speed or signal integrity is the ceramic flip chip, such as an SRAM chip package on a 1 inch ceramic substrate having a ball grid array ("BGA") structure containing up to 300 solder balls with a pitch of about 1.27 mm. This chip reaches operational temperatures between about 27 and 110 degrees Celsius. Unfortunately, as mentioned above this type of chip package has a tendency to fail during operation because of its excessive thermal cycling properties. More specifically, the differences in the CTE between the ceramic package and the fiberglass/resin PCB assembly causes excessive strain on the BGA pins at the edges of the chip during operational cycles. Consequently, the BGA joints flake or crack to form electrical opens making the package unreliable and ineffective.

The magnitude of the operational strain on the BGA pins depends on the geometry of the chip, the temperature difference and the CTE's of the materials involved.

The operating temperature of a given chip depends on its function, signal speed and technology. As performance increases and chip size decreases, temperatures tend to follow. It is very difficult to keep chips operating at a low temperature. The materials can be changed at a price. Exotic board materials with smaller CTE's (closer to ceramics) are available. However, they do not have the track record of success that conventional FR4 board materials. In turn, their electrical properties are so different, that board designs have to be adjusted for them. Given the current focus on keeping costs low, this is an unattractive option.

The present invention is directed to overcoming, or at least reducing the effects of, one or more of the problems set forth above.

SUMMARY OF THE INVENTION

In one aspect of the present invention, a semiconductor device assembly is provided for reducing the development of electrical opens created during operational cycles. More specifically, the present invention provides a semiconductor chip; a ball grid array ("BGA") structure; a substrate coupled between the chip and the BGA structure; a plurality of quad flat panel ("QFP") leads coupled to said substrate; and a protective layer bonded to an over the chip and a portion of the substrate adjacent the chip.

In another aspect of the instant invention, a process is provided for fabricating a semiconductor device. More specifically, the process includes the steps of providing a substrate including first and second surfaces; attaching a plurality of quad flat panel ("QFP") leads to the substrate on a first surface; securing a semiconductor chip to a second surface of the substrate; encapsulating the chip and a portion of the substrate adjacent the chip; and coupling a ball grid array ("BGA") structure to the substrate on the first surface.

In still another aspect of the instant invention provides a chip package assembly. More specifically, the present assembly includes a semiconductor chip; a ball grid array ("BGA") structure; a substrate coupled between the chip and the BGA structure; a protective layer encapsulating the chip and a portion of the substrate adjacent the chip; and a plurality of conductive leads electrically coupled between the assembly and PCB that provide a flexible characteristic for accommodating the physical changes that the resultant structure endures during operational cycles.

BRIEF DESCRIPTION OF THE DRAWINGS

Other aspects and advantages of the invention will become apparent upon reading the following detailed description and upon reference to the drawings, in which.

Figure 1A:
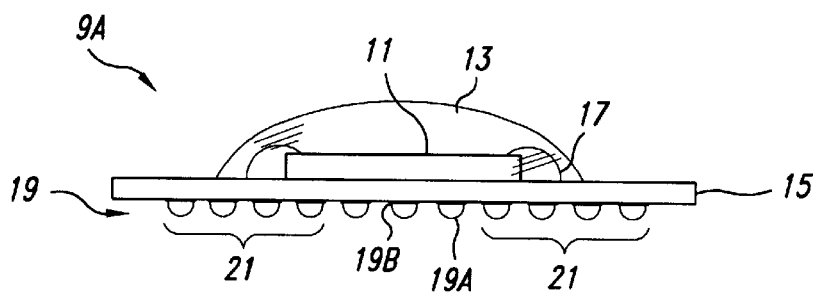
FIGS. 1A and 1B illustrate a cross-sectional and a top plan view of a conventional BGA assembly before being attached to a PCB.
Figure 1B:
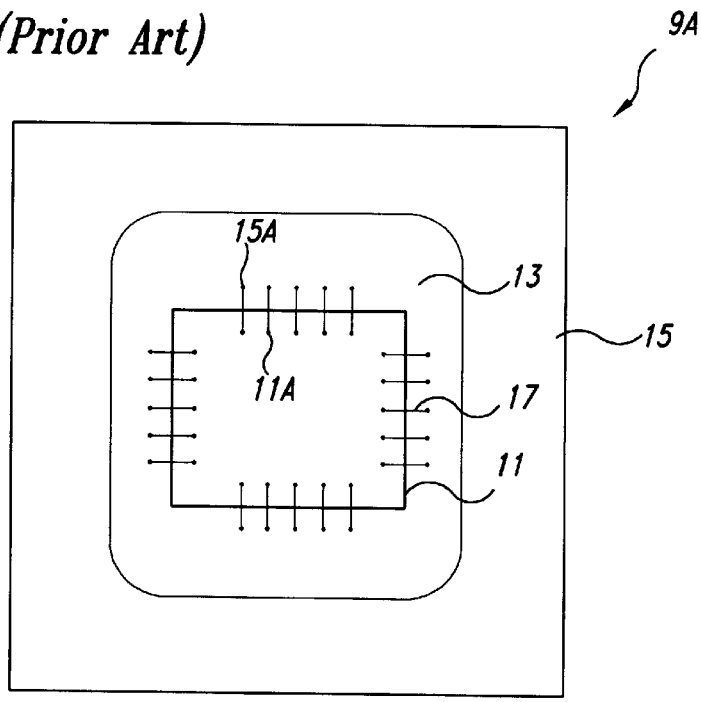
Figure 2:
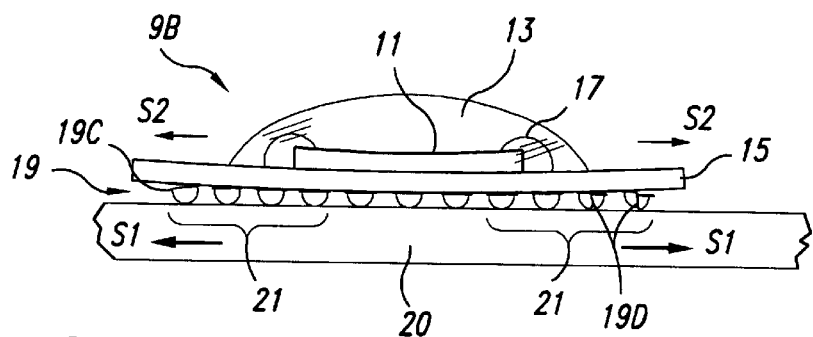
FIG. 2 illustrates a cross-sectional view of the conventional BGA assembly of FIGS. 1A and 1B after being attached to a PCB and activated.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In general, the present invention provides a hybrid chip package assembly that combines the high-speed signal benefits of a ball grid array ("BGA") structure with the solderability and reliability of quad flat pack ("QFP") leads. More specifically, the present invention provides a conventional BGA package wherein at least one peripheral row of solder balls is replaced by a plurality of flexible leads, such as gull wing QFP pins. This inventive package assembly will allow the high-speed BGA leads to remain soldered for a long term because the strain incurred during operational cycles is small near the center of the chip. In turn, the flexible QFP leads will tolerate the large strains adjacent the chip periphery that are created by the different coefficient thermal expansion ("CTE") properties associated with each material used to manufacture a high speed chip package and a printed circuit board ("PCB").

Figure 3A:
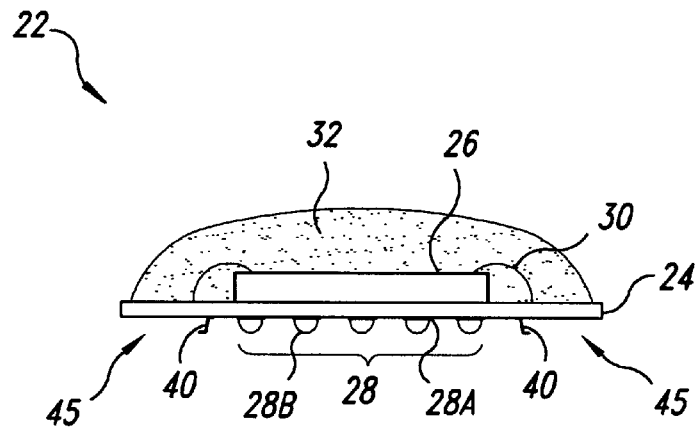
FIGS. 3A and 3B illustrate a cross-sectional and a bottom plan view of a BGA assembly in accordance with one embodiment of the present invention.
Figure 3B:
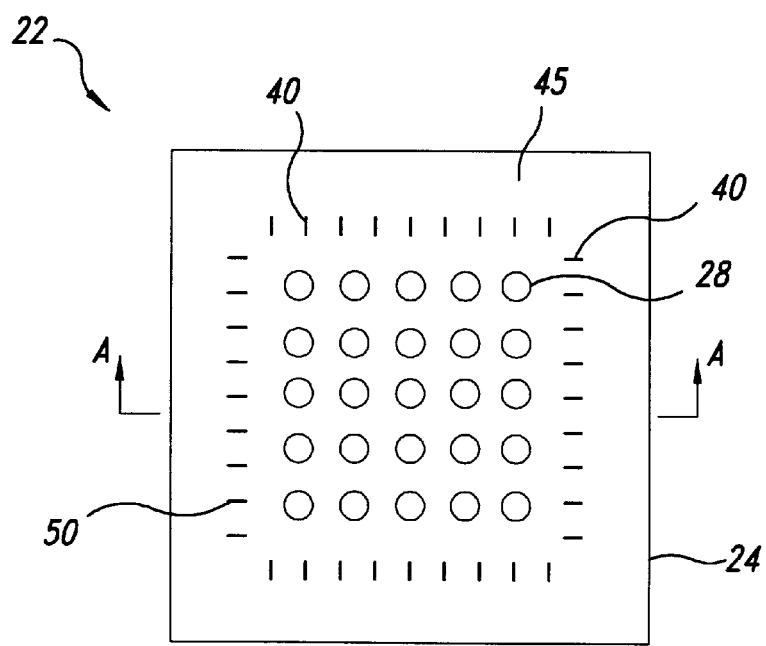

Referring now to the drawings, FIGS. 3A and 3B illustrate a hybrid chip package 22 in accordance with one embodiment of the present invention. More specifically, FIG. 3A shows a cross-sectional view of a hybrid chip package 22 having a BGA substrate 24 conventionally coupled between a semiconductor chip 26 and a BGA structure 28. The metallic bond wires 30 and the bottom surface of chip 26 electrically couple the I/O terminals (not shown) of the semiconductor chip 26 to the QFP leads 40 and the BGA structure 28 via the substrate 24. A protective layer 32 of an epoxy resin material covers the chip and an adjacent portion of the substrate 24.

The BGA structure 28 includes an array of conductive paste pads 28A coupled between the substrate 24 and the conductive bumps 28B. Depending on the operational characteristics (e.g., cycle temperatures) and structural characteristics (e.g., terminal layout) of the chip 24, the pitch and number of solder balls for the BGA structure may change for any given package. However, for most embodiments of this invention the pitch for the BGA structure will define a 4×4 to 25×25 array of solder balls (i.e. between about 16 to 625 solder balls) for a conventional high speed and/or high temperature chip.

The QFP leads 40 couple to the substrate 24 along a peripheral region 45 that encompasses the BGA structure 28 on the bottom surface of the substrate 24. In a preferred embodiment, the QFP leads 40 are brazed onto the substrate bottom surface at a first end. The other end of the QFP leads and the solder balls of the BGA structure are soldered to a printed circuit board ("PCB") (not shown) by conventional methods. As an alternative embodiment, the first ends of the QFP leads 40 could be adhesively coupled to the substrate bottom surface or within a contact via using a conductive adhesive and conventional methods. The adhesive material could be an epoxy or an adhesive spray having conductive flakes (e.g., silver, gold, etc.). In turn, the first end of the QFP leads 40 could be platted or embedded to the substrate.

Figure 4A:
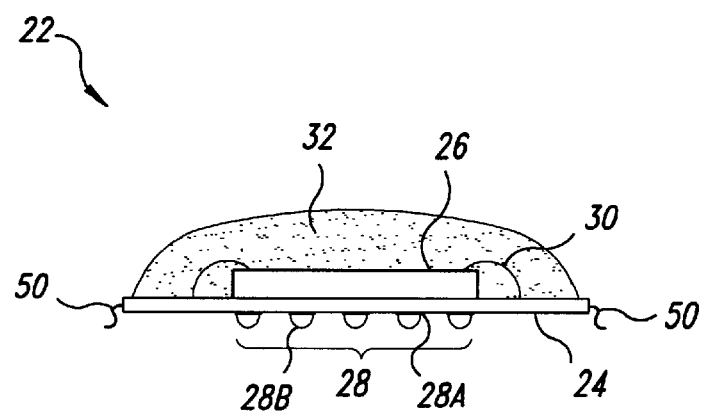
FIGS. 4A and 4B illustrate a cross-sectional and a bottom plan view of a BGA assembly in accordance with another embodiment of the present invention.
Figure 4B:
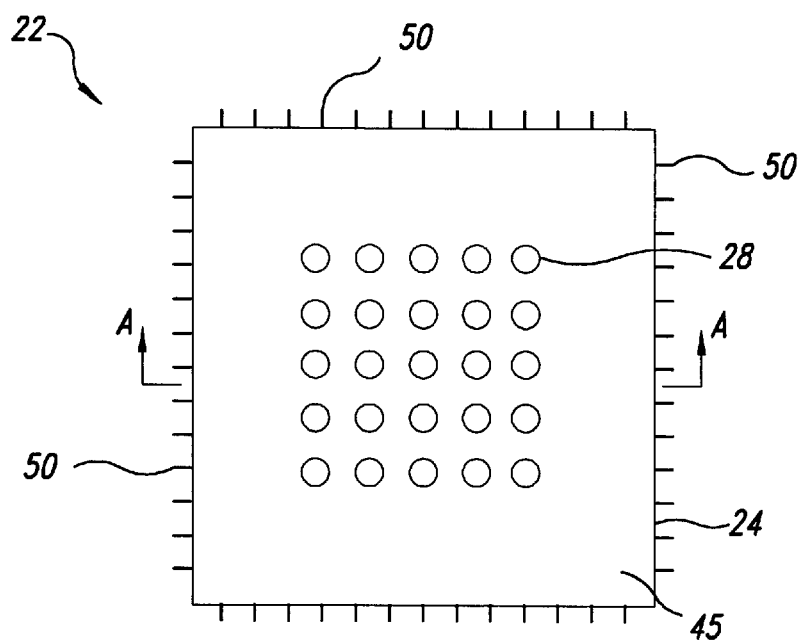

Referring now to FIGS. 4A and 4B, another embodiment of the present invention is illustrated for attaching the QFP leads of FIGS. 3A and 3B. In particular, the QFP leads 50 are attached to the substrate edge to provide a maximum separation from the BGA structure 28. With this embodiment the QFP leads 50 would preferably provide an "S" type pin to allow for a greater flexibility in the inventive hybrid chip package. In turn, the attached "S" type pins would be either brazed or inserted into any edge of the substrate 24 along a single row.

Figure 5A:
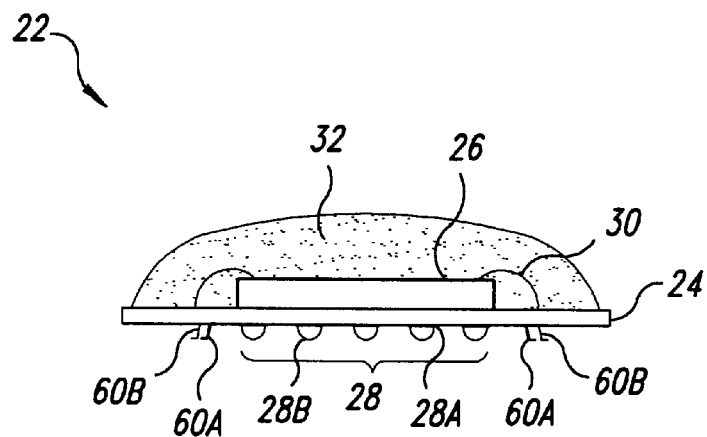
FIGS. 5A and 5B illustrate a cross-sectional and a bottom plan view of a BGA assembly in accordance with still another embodiment of the present invention.
Figure 5B:
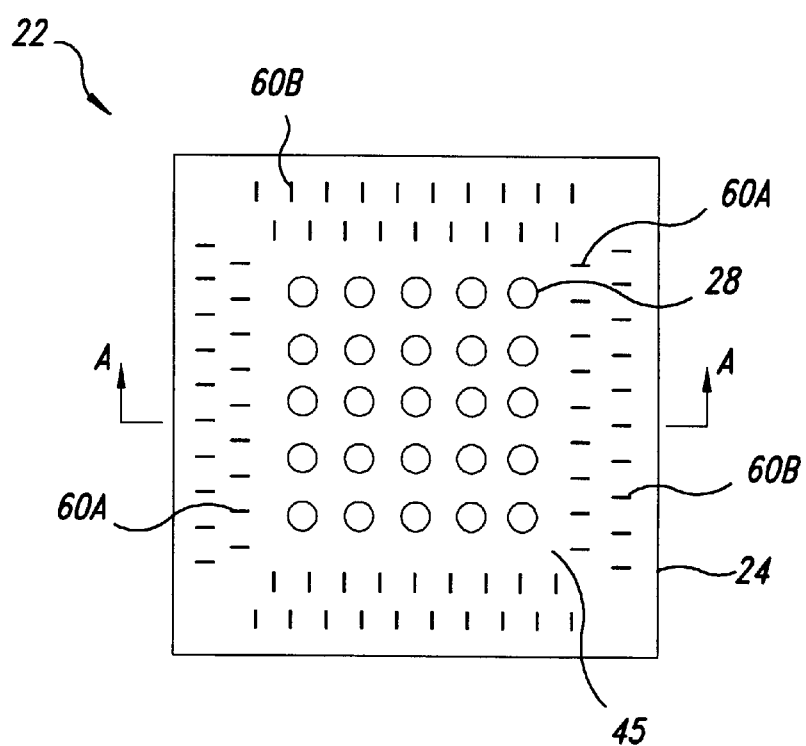

In another embodiment for arranging the QFP leads of FIGS. 3A and 3B, the user may choose to tier the QFP leads on the bottom surface of the substrate 24 as illustrated in FIGS. 5A and 5B. With this embodiment the user would be able to obtain a high number of leads that would only be limited by their lateral or diagonal pitch. In particular, the QFP leads 60A and 60B could be attached to the bottom surface of the substrate, as described above, to provide a tiered structure having multiple rows and columns. Consequently, this structure could provide a very large QFP lead structure to accommodate any number of I/O terminals provided by a chip.

For each embodiment described above, the QFP leads and the BGA structure will provide compatible height and pitch parameters relative to the substrate 24 and PCB. The pitch for the QFP leads can be between about 30 to 100 mils to provide between about 24 to 400 leads. Depending on the number of QFP leads 40 necessary to accommodate the I/O terminals of the semiconductor chip 26, the leads 40 may be positioned anywhere outside of the central area contained by the BGA structure 28. In particular, once the user determines the necessary high-speed BGA structure 28 to accommodate the desired chip 26, the QFP leads 40 can be attached to the substrate 24 at any location between the peripheral edge of the BGA structure 28 and the substrate 24.

The ability to position the QFP leads 40 along any peripheral region 45 of the substrate 24 allows the user to increase the number of leads for a chip 26 very easily. In fact, given that the leads can be chosen to flex enough to absorb any temperature related strains, the only considerations that the user must take into account during assembly are the operational pitch limitations of the desired QFP leads and the number of I/O terminals of the desired chip that the QFP leads will have to accommodate.

In the particular illustrated embodiments, the conductive QFP leads, bumps and paste pads can be constructed from a conductive material such as silver solder, silver, or gold. The substrate 24 is preferably a ceramic ball grid array substrate such as a FR-4 or a cyanate ester substrate, however, it could also be any conventional substrate selected form the group including other tape, plastic (laminate), or ceramic substrates could be used as the BGA substrate 24. The metallic bond wires 30 are constructed from a conductive material such as copper, gold, palladium, or aluminum and electrically coupled between the substrate 24 and the QFP leads using a known wire bonding technique.

It is an intention of the above embodiments to provide an inventive hybrid package that can accommodate any high-speed semiconductor chip, such as a central processing unit ("CPU"), CPU peripheral support, graphic engines, ASIC chips, etc., that can operate at various cycle rates while reaching temperatures of between about 27°–110° C. More specifically, if a ASIC chip were conventionally coupled to a one inch square ceramic substrate, such as an FR-4, the substrate would preferably provide about 80 gull wing leads brazed to a peripheral region of the substrate to surround a BGA structure having 144 solder bumps. In other words, about 80 solder bumps have been removed from a peripheral region of a conventional BGA package and replaced with the same number of QFP leads as described above. In the above example a pitch of 50 mils is used for the gull wings and a pitch of 50 mils is used for the BGA structure.

The skilled artisan should appreciate that the number of solder balls used for the BGA structure and the subsequent pitch between each solder ball of the BGA structure will define the peripheral region for the QFP leads to be attached as illustrated above. In turn, although the preferred QFP lead type is a conventional gull wing, other QFP lead types could be used for any of the above embodiments such as those selected from the group including "J", "I", and "S". However, as mentioned earlier, the pitch used for arranging the QFP leads on a substrate may vary for each QFP lead type used.

Process of Invention

Figure 6:
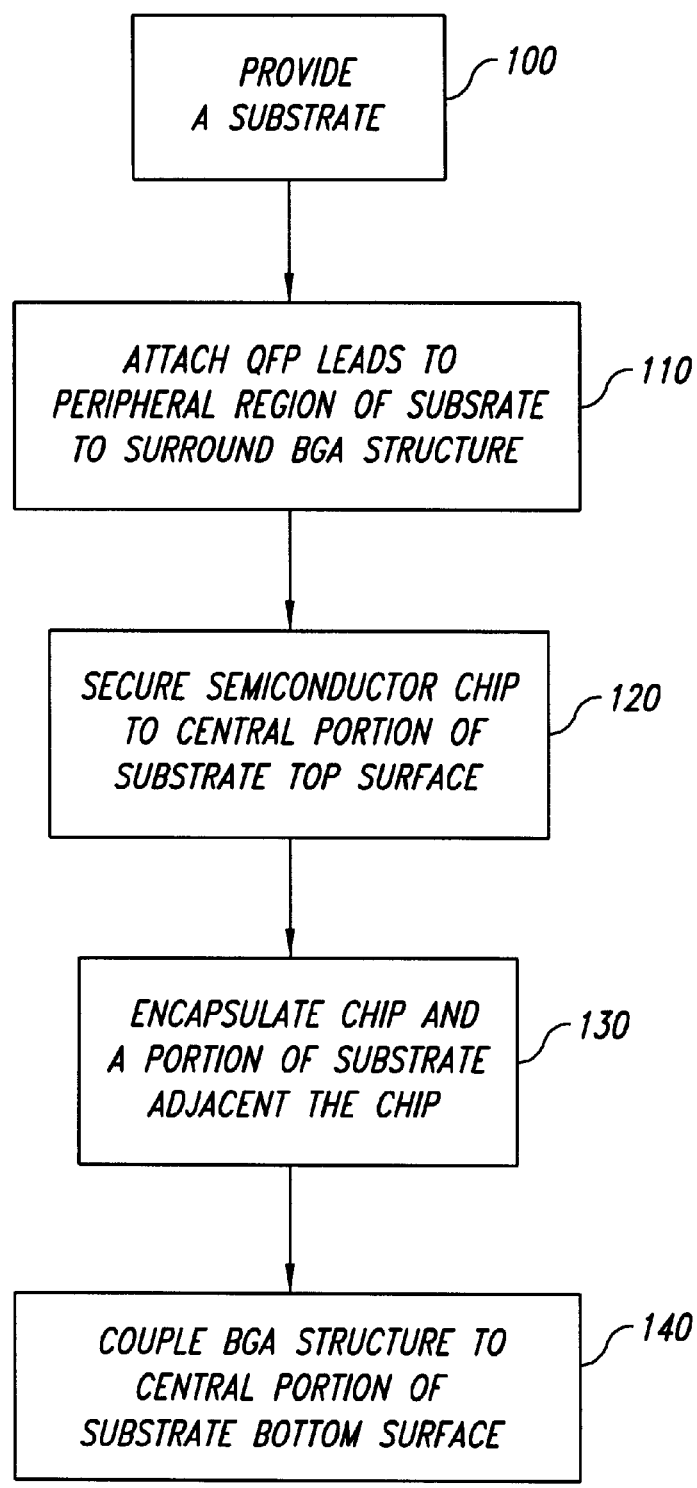
FIG. 6 illustrates a flow chart outlining a basic process for manufacturing any embodiment of the present invention.

Having described the preferred component layouts for the present invention, a description of the process will now follow. The process is generally illustrated in FIG. 6 and begins by providing a substrate 100. Next, a plurality of QFP leads are coupled to a peripheral region of the substrate bottom surface 110; a semiconductor chip is secured to a central portion of the substrate top surface 120; the chip and a portion of the substrate is encapsulated 130; and a BGA structure is secured to a central portion of the substrate bottom surface 140. As illustrated above, the QFP leads surround the BGA structure.

Persons of ordinary skill in the relevant arts should appreciate that the ordering of the process steps, other than providing a substrate and encapsulating the chip after it has been attached, is not material to the practice of the invention. For instance, the QFP leads could be coupled to the bottom surface of the substrate if a conductive adhesive is used to couple the QFP leads to the substrate after the BGA structure is centrally coupled to the substrate.

The method of FIG. 6 can be employed to manufacture any of the above embodiments. Consequently, for purposes of clarity the following specific example will describe a process of manufacturing an inventive hybrid chip package with reference to the embodiment of FIGS. 3A and 3B.

Initially, once a substrate 24 is obtained, such as a ceramic FR-4 substrate, a plurality of QFP gull wing leads 40 are brazed onto a bottom peripheral region of the substrate. Next, the desired semiconductor chip 26 is coupled to the top surface of the substrate 24 and metallic bonding wires 30 are coupled between the semiconductor chip 26 and the substrate 24 using known techniques. At this stage, all I/O terminals of the chip have been coupled to the substrate to interact with either the QFP leads or the BGA structure to be attached.

An encapsulating layer 32 is deposited over the chip 26 and an adjacent portion of the substrate 24. The curing process involves the protective layer 32 shrinking around the semiconductor chip 26 and an adjacent portion of the substrate. Once cured, an array of solder bumps 28B is deposited onto a complementary array of paste pads attached to the bottom surface of the substrate and the resultant package is soldered to a PCB using conventional methods.

Summary

As discussed above with reference to the prior art, this inventive assembly does not look to change or alter the CTE properties of the BGA chip package by using different materials or reducing the operational temperature of a chip. Instead, the present invention provides an assembly and process for replacing solder balls of a conventional BGA structure that reside at a peripheral region of the substrate with a flexible QFP lead to produce a high-speed BGA chip package that will be reliable, effective, and efficient during any operational cycle and temperature. Consequently, any temperature applied or cycle rate used with the inventive package that may alter the material integrity of the structure and thereby create a strain within the inventive hybrid package coupled to a PCB will be absorbed by the flexible QFP leads and thereby prevent electrical opens.

The particular embodiments disclosed above are illustrative only, as the invention may be modified and practiced in different but equivalent manners apparent to those skilled in the art having the benefit of the teachings herein. Furthermore, no limitations are intended to the details of design herein shown, other than as described in the claims below. It is therefore evident that he particular embodiments disclosed above could be altered or modified and all such variations are considered within the scope and spirit of the invention. Accordingly, the protection sought herein is as set forth in the claims below.

What is claimed is:

1. A process of fabricating a semiconductor device assembly, comprising:

providing a substrate including first and second surfaces;

attaching a plurality of quad flat panel ("QFP") leads to the substrate on a first surface;

securing a semiconductor chip to a second surface of the substrate;

encapsulating the chip and a portion of the substrate adjacent the chip; and coupling a ball grid array ("BGA") structure to the substrate on the first surface.

2. The process of claim 1, wherein attaching a plurality of QFP leads provides a flexibility to a peripheral region surrounding the BGA substrate to reduce the development of electrical opens while the assembly reacts to operational temperature cycles.

3. The process of claim 1, wherein attaching a plurality of QFP leads further includes coupling said plurality of QFP leads to the substrate by a technique selected from the group comprising brazing, embedding, plating, and adhering.

4. The process of claim 1, wherein attaching a plurality of QFP leads further includes adhesively coupling said leads to the first surface of said substrate using a material having conductive properties.

5. The process of claim 1, wherein attaching a plurality of QFP leads further includes tiering the leads around a peripheral region of said BGA structure.

6. The process of claim 1, wherein coupling the BGA structure includes coupling an array of conductive bumps, and conductive paste pads between the conductive bumps and the substrate.

7. The process of claim 1, wherein providing the substrate includes providing a substrate comprised of a material selected from the group including tape, plastic, laminate, and ceramic.

8. The process of claim 7, wherein the substrate is selected from the group including BT laminate, FR-4, and cyanate ester.

9. The process of claim 1, further including attaching bond wire between said chip and said substrate.

* * * * *